US008168522B2

(12) United States Patent
Nakajima

(10) Patent No.: US 8,168,522 B2
(45) Date of Patent: May 1, 2012

(54) METHOD FOR FABRICATING SEMICONDUCTOR DEVICE

(75) Inventor: Kazuaki Nakajima, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 12/718,449

(22) Filed: Mar. 5, 2010

(65) Prior Publication Data

US 2010/0291765 A1    Nov. 18, 2010

(30) Foreign Application Priority Data

May 12, 2009    (JP) ................................. 2009-115895

(51) Int. Cl.
*H01L 21/44*    (2006.01)
(52) U.S. Cl. ................. 438/592; 438/655; 257/E21.636
(58) Field of Classification Search .................. 438/592, 438/649, 651, 655, 664; 257/E21.636
See application file for complete search history.

(56) References Cited

U.S. PATENT DOCUMENTS

2007/0007602 A1\*  1/2007  Oda et al. ...................... 257/369
2008/0277736 A1   11/2008  Nakajima

FOREIGN PATENT DOCUMENTS

JP    2007-019396    1/2007

\* cited by examiner

*Primary Examiner* — Thanhha Pham
(74) *Attorney, Agent, or Firm* — Turocy & Watson, LLP

(57) ABSTRACT

An aspect of the present disclosure, there is provided a method for fabricating a semiconductor device, including, forming a gate insulating film on a semiconductor substrate, forming a metal film on the gate insulating film, depositing a metal-silicon compound film on the metal film without exposing the semiconductor substrate into atmosphere after forming the metal film, forming a silicon film on the metal-silicon compound film, and etching the metal film, the metal-silicon compound film, and the silicon film.

14 Claims, 4 Drawing Sheets

METHOD FOR FABRICATING SEMICONDUCTOR DEVICE

CROSS REFERENCE TO RELATED APPLICATION

This application is based upon and claims the benefit of priority from prior Japanese Patent Application No. 2009-115895, filed on May 12, 2009, the entire contents of which are incorporated herein by reference.

TECHNICAL FIELD

Exemplary embodiments described herein relate to a method for fabricating a semiconductor device, in particular, to the method including a metal insert poly-Si stack (MIPS) structure.

BACKGROUND

Investigations have been made about application of a metal gate electrode wherein a depletion region is not generated as a gate electrode of a transistor.

As a metal gate electrode structure, there is known a laminated structure including a silicon film and a metal film wherein the metal film is arranged as a lower portion of a gate electrode and the silicon film is arranged on the metal film.

The structure has a problem that when a resistance of the interface between the silicon film and the metal film rises, the switching speed of the transistor is lowered.

For example, a structure wherein a silicide layer is formed at the interface between a silicon film and a metal film is disclosed.

The method wherein the metal film and the silicon film are caused to react with each other to form the silicide layer, has an advantage that the silicide layer can be formed selectively only on a portion where the metal film and the silicon film contact each other.

However, there remains a problem that the surface of the metal film is oxidized so that the resistance of the gate electrode is increased, whereby a desired interfacial resistance is not obtained.

SUMMARY

An aspect of the present disclosure, there is provided a method for fabricating a semiconductor device, including, forming a gate insulating film on a semiconductor substrate, forming a metal film on the gate insulating film, depositing a metal-silicon compound film on the metal film without exposing the semiconductor substrate into atmosphere after forming the metal film, forming a silicon film on the metal-silicon compound film, and etching the metal film, the metal-silicon compound film, and the silicon film.

DETAILED DESCRIPTION (Embodiment)

Hereinafter, an embodiment of the invention will be described with reference to the drawings. An embodiment of the invention will be described with reference to FIGS. 1 and 2.

FIGS. 1 and 2 are cross-sectional views showing a method for fabricating a semiconductor device according to the embodiment. The device includes transistors each having an MIPS structure.

Figure 1A:
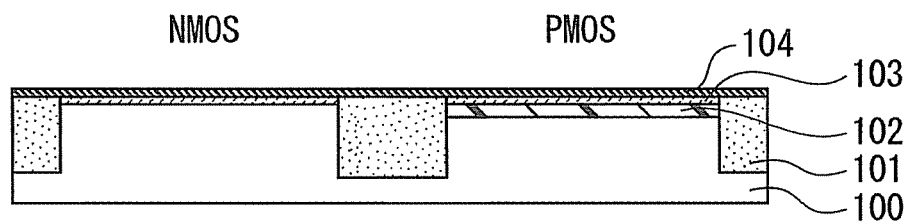
FIGS. 1A to 1E are cross-sectional views showing a method for fabricating a semiconductor device according to an embodiment of the invention.

As shown in FIG. 1A, element isolations 101 are formed on a semiconductor substrate 100, for example, a single crystalline silicon substrate 100. A SiGe (Silicon Germanium) layer 102 is formed in a p-type MOS area (PMOS) of the substrate 100. The SiGe layer 102 causes an increase of carrier mobility. Subsequently, interfacial layer 103 including nitrogen is formed on an n-type MOS area of the semiconductor substrate 100 and on the SiGe layer 102 on the p-type MOS area.

Furthermore, a gate insulating film 104 including hafnium (Hf) is formed on the element isolations 101 and the interfacial layer 103 by chemical vapor deposition (CVD) using an organic source gas or the like.

Figure 1B:
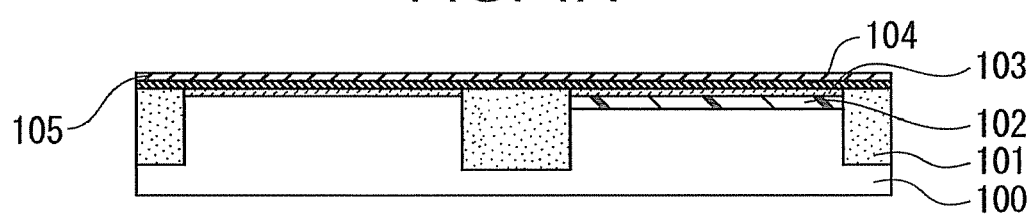

As shown in FIG. 1B, a threshold control layer 105, for example, a Mg film, is formed into a film thickness of 0.4 nm.

Figure 1C:
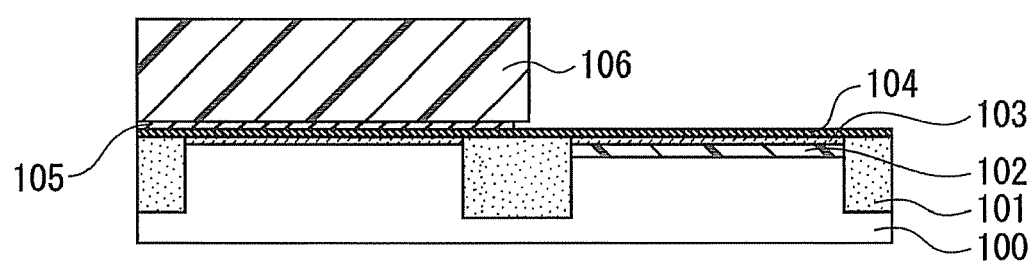

As shown in FIG. 1C, a resist film 106 is formed on the Mg film 105 on the n-type MOS area, and then the Mg film on the p-type MOS area is removed while the Mg film 105 is caused to remain on the n-type MOS area. The Mg film 105 controls a threshold voltage of a transistor to be formed in/on the n-type MOS area.

Figure 1D:
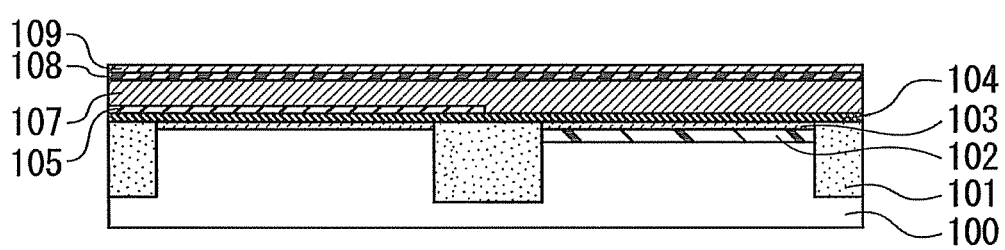

As shown in FIG. 1D, a metal film 107, for example, a TiN film 107 is formed into a film thickness of 10 nm. Thereafter, a metal silicon compound film, for example, a TiSix film 108, is deposited into a film thickness of 3 nm onto the TiN film 107. The TiN film 107 and the TiSix film 108 are continuously formed in a same apparatus without being exposed to the atmosphere.

The TiN film 107 and the TiSix film 108 are deposited by sputtering, for example. The TiSix film 108 is deposited by use of a TiSix target under conditions that the DC power and the flow rate of Ar are set to 1000 kW and 20 sccm, respectively. In the case, the composition of the TiSix target is desirably adjusted to set the ratio of Si/Ti to 2 or more. The TiSix film may be deposited by co-sputtering method using two targets made of Ti and Si, respectively, without using any TiSix target.

Furthermore, a silicon oxide film 109 is formed on the surface of the TiSiX film 108 since the surface of the TiSix film 108 is exposed to the atmosphere. The silicon oxide film 109 formed in the step can easily be removed with treatment with a chemical solution.

Figure 1E:
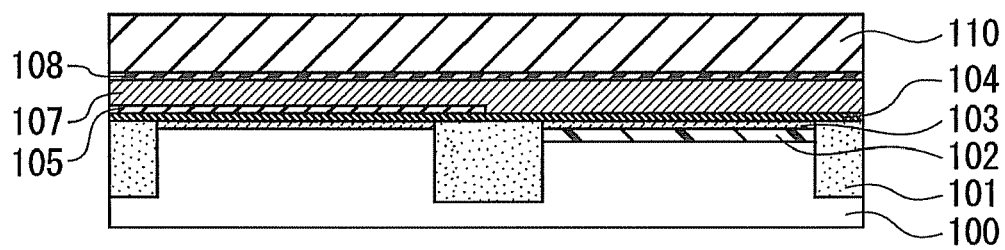

As shown in FIG. 1E, the silicon oxide film 109 is removed by treatment using diluted HF or the like, and then a silicon film 110 is formed. The silicon film 110 is a poly crystalline silicon film having a thickness of 80 nm, for example. In this way, the silicon oxide film 109 can be easily removed by cleaning, which is ordinarily conducted before the formation of the silicon film 110. Since the TiN film 107 and the TiSix film 108 are continuously formed, no $TiO_2$ film is formed. Thus, an insulating film, such as a silicon oxide film and a $TiO_2$ film, is not interposed between the metal film 107 and the silicon film 110, so that the interfacial resistance between the metal film 107 and the silicon film 110 can be kept into a low value.

Figure 2A:
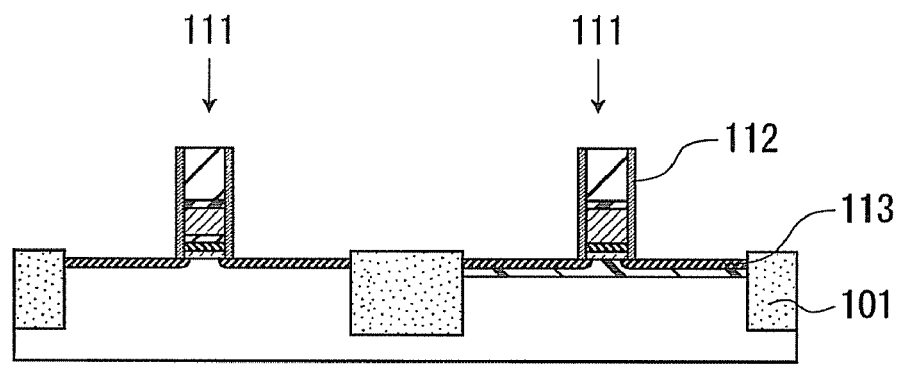
FIGS. 2A to 2C are cross-sectional views showing the method for fabricating the semiconductor device according to the embodiment of the invention.

Thereafter, as shown in FIG. 2A, the silicon film 110, the metal-silicon compound film 108, the metal film 107, the threshold control layer 105, the gate insulating layer 104 and the interfacial layer 103 are anisotropically etched to form a gate structure 111 having a gate width of 30 nm, for example.

Furthermore, a silicon nitride film 112 is formed on the entire surface, and then the silicon nitride film 112 is etched back to form a structure wherein side wall portions of the gate electrodes are surrounded by the silicon nitride film 112. Furthermore, for instance, $As^+$ ions are implanted into the n-type MOS area and $B^+$ ions are implanted into the p-type MOS area. A heat treatment is performed at 800° C. for 5 seconds to form shallow diffusion layers 113.

Figure 2B:
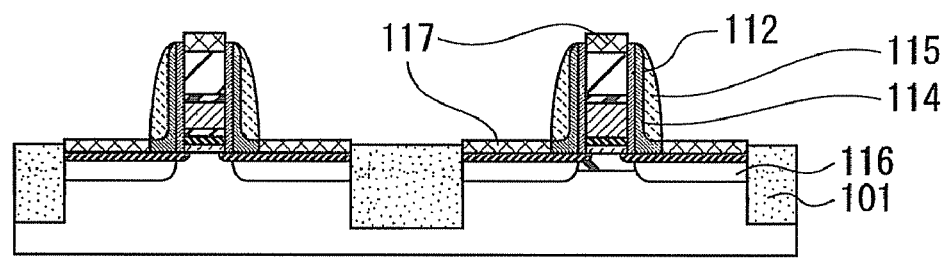

As shown in FIG. 2B, a silicon nitride film 114 and a silicon oxide film 115 are formed, and then the silicon nitride film 114 and the silicon oxide film 115 are etched back. Furthermore, for instance, $P^+$ ions are implanted into the n-type MOS area, and $B^+$ ions are implanted into the p-type MOS area. A heat treatment is performed at 1030° C. for 5 seconds to form deep diffusion layers 116.

Next, a NiPt film, for example, is formed into a film thickness of 10 nm on the entire surface, and a heat treatment is performed at 350° C. for 30 seconds to cause the NiPt film to react with the upper portion of the silicon film 110. An unreacted region of the NiPt film is removed with a mixed solution including hydrochloric acid and nitric acid, for example. Thereafter, a heat treatment is performed at 500° C. for 30 seconds. In this way, a silicide layer 117 constituted with NiSix is formed on the silicon film 110 and the shallow diffusion layers 113.

Figure 2C:
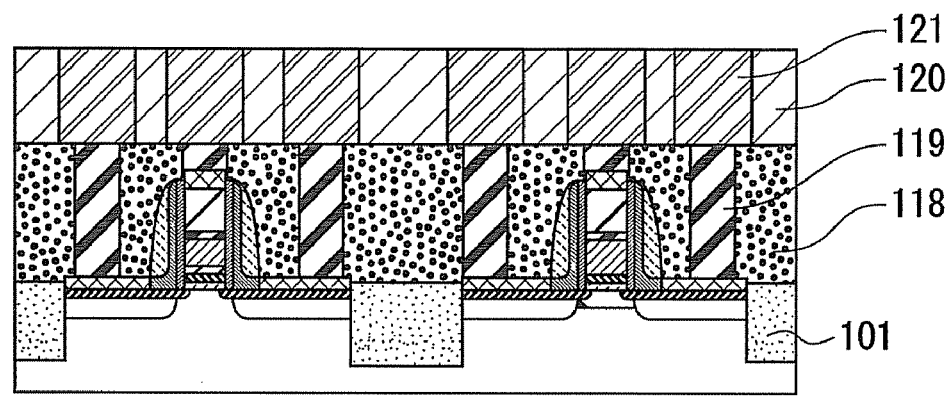

Furthermore, as shown in FIG. 2C, a desired contact pattern is formed on a first interlayer insulating film 118 between the gate structures 111, and a Ti/TiN/W film, for example, is embedded into concave portions in the contact pattern. The Ti/TiN/W film is planarized by chemical mechanical polishing (CMP), thereby forming contacts 119. Furthermore, a second interlayer insulating film 120 is formed onto the entire surface, and then a desired pattern is formed. A TaN/Cu film is then embedded into concave portions of the pattern, and the TaN/Cu film is planarized by CMP, thereby forming Cu wirings 121 electrically connecting with the contacts 119.

In this way, a transistor having a gate structure are formed wherein an electrode is a laminated structure including the metal film 107, the metal-silicon compound film 108, the silicon film 110 and the silicide layer 117.

In the embodiment, the TiSix film 108 being a metal silicon compound film is formed on the TIN film 107 being a metal film, and subsequently the silicon film 110 is formed. Advantageous effects of the forming method will be described hereinafter.

Figure 3:
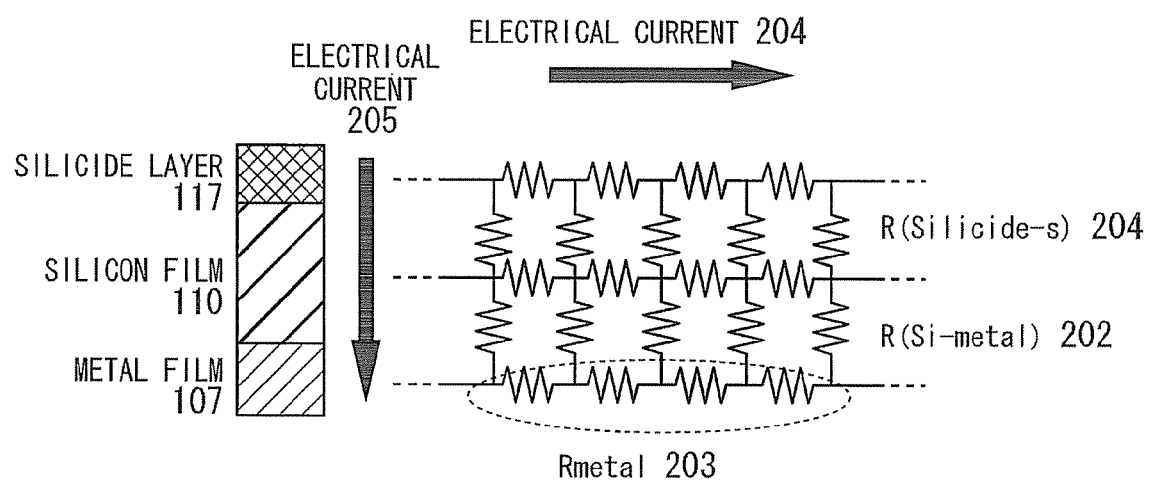
FIG. 3 is a view showing a gate electrode structure and a distributed constant circuit.

A relationship between the structure of a gate electrode and the resistance of the structure is described herein with reference to FIG. 3. In a case where the gate electrode has a laminated structure including the metal film (TiN) 107, the silicon film 110, and the silicide layer 117, a distributed constant circuit of the gate electrode is shown in FIG. 3. An electric current 204 flowing along the direction of the wiring of the gate electrode is conducted through the silicide layer 117 since the resistance of the silicide layer has the lowest value.

On the other hand, an electric current 205 flowing in the direction perpendicular to the gate electrodes is conducted through an interfacial resistance 201 between the silicide layer 117 and the silicon film 110 and through an interfacial resistance 202 between the silicon film 110 and the metal film 107, so as to flow into a resistance 203 of the metal film 107, which is formed as the lowest layer.

In order to prevent lowering in the switching speed of the transistors, it is necessary to lower the resistance of the silicide layer in the wiring direction, and lower the interfacial resistance in the direction perpendicular to the wiring direction.

However, according to conventional methods, the interfacial resistance 202 between the silicon film 110 and the metal film 107 cannot be kept sufficiently low.

Figure 4A:
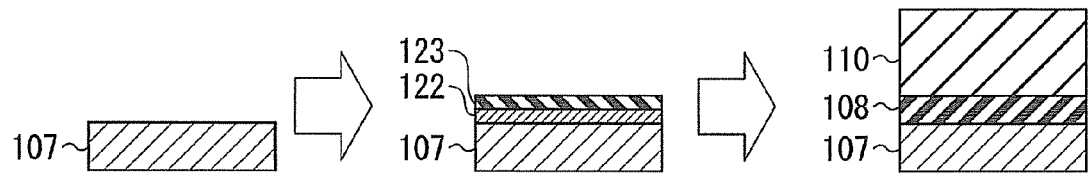
FIGS. 4A to 4E are cross-sectional views showing a method for fabricating a gate electrode.

In order to decrease the interfacial resistance 202 between the silicon film 110 and the metal film 107, there is a method of forming a silicide layer at the interface between the silicon film 110 and the metal film 107, as shown in FIG. 4A. Specifically, a Ti film 123 is formed on a silicon film 122 on the TiN film 107, and the silicon film 122 and the Ti film 123 are caused to conduct the silicide reaction to form the metal-silicon compound film 108. Furthermore, the silicon film 110 is formed on the metal-silicon compound film 108 to form an electrode having a laminated structure including the TiN film 107, the metal-silicon compound film 108 and the silicon film 110. In the case, a step of turning the upper portion of the silicon film 110 into the silicide to form the silicide layer 117 is omitted. In the case of such a conventional method, a problem described below is caused.

Figure 4B:
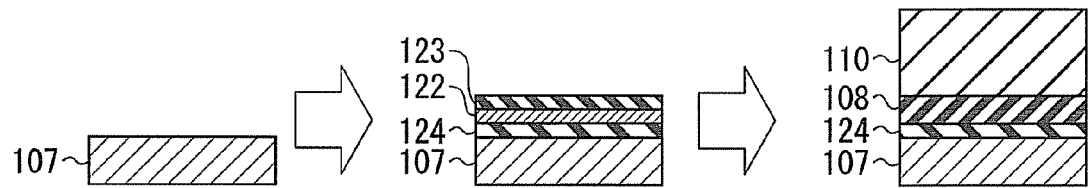

As shown in FIG. 4B, when the surface of the TiN film 107 is exposed to the atmosphere so as to be oxidized, a $TiO_2$ film 124 is formed on the surface of the TiN film 107. Since the $TiO_2$ film 124 cannot be removed by treatment with any chemical solution such as diluted HF or the like, the $TiO_2$ film 124 remains also after the silicon film 110 is formed. The $TiO_2$ film 124 is present at the interface between the TiN film 107 and the metal-silicon compound film 108, so that the interfacial resistance between the TiN film 107 and the metal-silicon compound film 108 rises. This causes an increase in the interfacial resistance 202 between the silicon film 110 and the metal film 107.

Figure 4C:
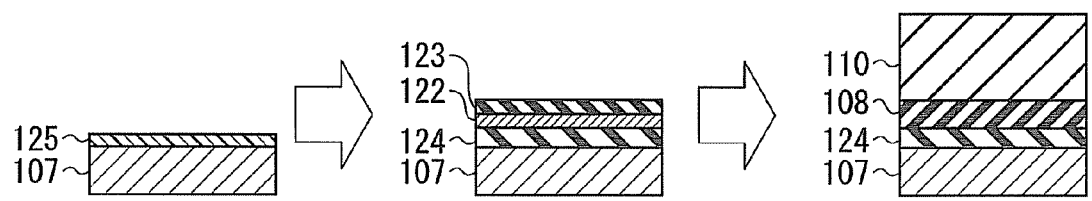

As shown in FIG. 4C, it may be supposed to adopt a method wherein a Ti film 125 is interposed between the TiN film 107 and the silicon film 122 to form a Ti silicide. However, the Ti film 125 is more easily oxidized than the TiN film 107 as far as the Ti film 125 and the silicon film 122 are not continuously formed. Thus, in the case, the $TiO_2$ film 124 is formed to have a larger thickness than in the case shown in FIG. 4B. Usually, the Ti film 125 is formed by sputtering while the silicon film 122 is formed by CVD. Thus, it is difficult to form the Ti film 125 and the silicon film 122 continuously without exposing to the atmosphere.

Figure 4D:
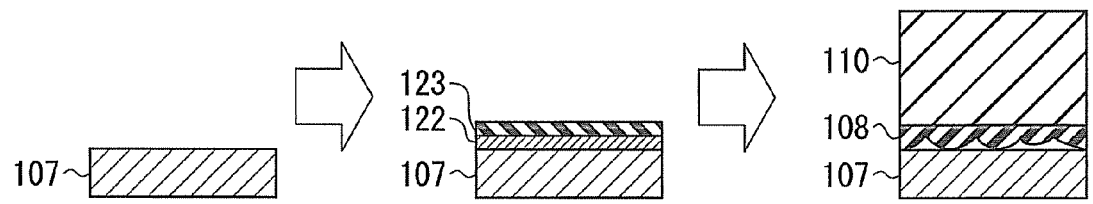

As shown in FIG. 4D, in the case where the silicon film 122 and the Ti film 123 are caused to conduct a silicide reaction to form the metal silicon compound film 108, silicon is diffused through a thermal step or the like at the time of forming a diffusion layer, so that voids are formed in the lower portion of the metal-silicon compound film 108. Thus, an increase in the interfacial resistance is caused between the TiN film 107 and the metal-silicon compound film 108. This results in an increase in the interfacial resistance 202 between the silicon film 110 and the metal film 107.

Figure 4E:
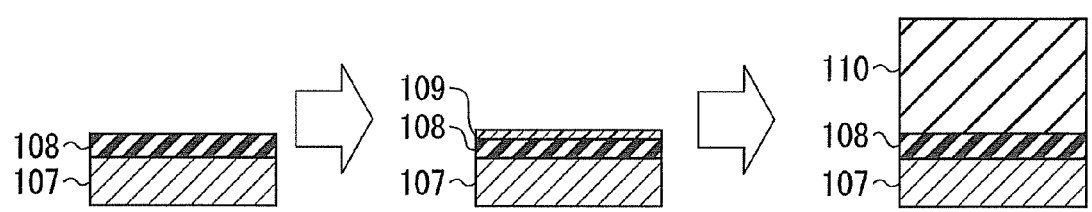

In the contrast to the method, as shown in FIG. 4E, the embodiment has a step of depositing the metal-silicon compound film 108, which is a TiSix film, beforehand onto the TiN film 107. The TiN film 107 and the TiSix film 108 are continuously formed in the same apparatus without being exposed to the atmosphere, thereby restraining the oxidation of the surface of the TiN film 107. Moreover, no silicide reaction is caused, so that the TiSix film 108 can be interposed between the TiN film 107 and the silicon film 110 without forming any void after the thermal step. Additionally, an undesired film formed on the surface of the TiSix film 108 can easily be removed by conducting treatment with diluted HF or the like before the silicon film 110 is formed onto the TiSix film 108 since the undesired film is the silicon oxide film 109. Thus, the interfacial resistance 202 between the silicon film 110 and the metal film 107 can be kept low.

Accordingly, the interfacial resistance in the direction to perpendicular to the gate electrodes can be made lower. As a result, as compared with the conventional method, the method of the embodiment can markedly improve the switching speed of the transistors far better.

Furthermore, by interposing the silicide film, which is the metal silicon-compound film 108, between the metal film 107 and the silicon film 110, the stress of the films can be decreased. In other words, a thin layer made of a metal nitride or metal carbide, such as a TiN film, has a compressive stress of several gigapascals to several tens of pascals, and thus when the metal nitride or the metal carbide is used in a gate electrode, a large compression stress is also applied to the gate insulating film. As a result, the reliability of the gate insulating film is deteriorated. By contrast, the silicide layer has tensile stress, and thus when a metal nitride is laminated onto the layer, stress applied to the gate insulating film can be relieved.

In the embodiment, the TiN film is used as the metal film 107, however, a nitride, carbide, silicon nitride or silicon carbide of Zr or Hf in the Group IV, which is the same group which Ti belongs to, may be used as a material of the metal film 107. Further, a nitride, carbide, silicon nitride or silicon carbide of an element (for example, V, Nb or Ta) in the Group V or an element (for example, Mo or W) in the Group VI, may be used as a material of the metal film 107.

In the case, it is sufficient for the metal silicon compound film 108 interposed between the metal film 107 and the silicon film 110 that the film is a silicide film of an element (for example, Ti, Zr or Hf) in the Group IV, an element (for example, V, Nb or Ta) in the Group V, or an element (for example, Mo or W) in the Group VI. When the element of the metal film and that of the metal silicide film are elements in the same Group, the films are easily processed.

In the embodiment, the Hf-containing film is used as the gate insulating film 104, however, an oxide of Zr, Ti, Ta, Al, Sr, Y or La, for example, or a silicon oxide of such an element, such as $ZrSi_xO_y$ may be used as a material of the gate insulating film 104. Further, a laminated film including the oxide and the silicon oxide may be used as a material of the gate insulating film 104.

In the embodiment, in the threshold control layer 105, Mg is formed only on the n-type MOS area. However, a different element may be formed on the area. For example, a La film may be formed on the n-type MOS area and an $Al_2O_3$ film may be formed on the p-type MOS area.

Other embodiments of the present disclosure will be apparent to those skilled in the art from consideration of the specification and practice of the disclosure disclosed herein. It is intended that the specification and example embodiments be considered as exemplary only, with a true scope and spirit of the disclosure being indicated by the claims that follow. The disclosure can be carried out by being variously modified within a range not deviated from the gist of the disclosure.

What is claimed is:

1. A method for fabricating a semiconductor device, comprising:
   forming a gate insulating film on a semiconductor substrate,
   forming a metal film on the gate insulating film,
   depositing a metal-silicon compound film on the metal film without exposing the semiconductor substrate into atmosphere after forming the metal film,
   forming a silicon film on the metal-silicon compound film, and
   etching the metal film, the metal-silicon compound film, and the silicon film.

2. The method of claim 1, further comprising:
   removing an oxide film formed on a surface of the metal-silicon compound film before the silicon film is formed.

3. The method of claim 1, wherein
   the metal film is at least one of a nitride of elements in the Groups IV, V and VI, a carbide of elements in the Groups IV, V and VI, a silicon nitride, of elements in the Groups IV, V and VI and, a silicon carbide, of elements in the Groups IV, V and VI.

4. The method of claim 1, wherein
   the metal-silicon compound film includes at least one of metals in the Groups IV, V or VI.

5. The method of claim 1, wherein
   each of the metal film and the metal-silicon compound film includes at least one of metals in the same Group of Groups IV, V and VI.

6. The method of claim 1, wherein
   the semiconductor substrate has a p-type MOS area and an n-type MOS area.

7. The method of claim 6, further comprising:
   forming a SiGe layer on the p-type MOS area of the semiconductor substrate before forming the gate insulating film on the semiconductor substrate.

8. The method of claim 1, further comprising:
   forming an interfacial layer on the semiconductor substrate before forming the gate insulating layer.

9. The method of claim 6, further comprising:
   forming an interfacial layer on the n-type MOS area of the semiconductor substrate and on the SiGe layer on the p-type MOS area before forming the gate insulating layer.

10. The method of claim 6, further comprising:
    forming a threshold control layer on the gate insulating film in the n-type MOS area before the metal film is formed onto the gate insulating film.

11. The method of claim 10, wherein
    the threshold control layer on the n-type MOS area includes magnesium or lanthanum.

12. The method of claim 6, further comprising:
    forming a threshold control layer on the gate insulating film in the p-type MOS area before the metal film is formed on the gate insulating film.

13. The method of claim 12, wherein
    the threshold control layer in the p-type MOS area includes alumina.

14. The method of claim 1, wherein
    the gate insulating film is at least one of oxides of Hf, Zr, Ti, Ta, Al, Sr, Y and La, silicon oxides of Hf, Zr, Ti, Ta, Al, Sr and Y, and laminated films including the oxides and/or the silicon oxides.

* * * * *